(12) United States Patent
Moritoki et al.

(10) Patent No.: US 8,455,925 B2
(45) Date of Patent: Jun. 4, 2013

(54) SEMICONDUCTOR DEVICE AND METHOD FOR MANUFACTURING THE SAME

(75) Inventors: Masashige Moritoki, Kanagawa (JP);
Takamasa Itou, Kanagawa (JP);
Takashi Ogura, Kanagawa (JP);
Tsutomu Himukai, Kanagawa (JP);
Shigeaki Shimizu, Kanagawa (JP)

(73) Assignee: Renesas Electronic Coporation, Kanagawa (JP)

( * ) Notice: Subject to any disclaimer, the term of this patent is extended or adjusted under 35 U.S.C. 154(b) by 0 days.

(21) Appl. No.: 13/024,004

(22) Filed: Feb. 9, 2011

(65) Prior Publication Data
US 2011/0193136 A1 Aug. 11, 2011

(30) Foreign Application Priority Data
Feb. 10, 2010 (JP) ................................. 2010-027974

(51) Int. Cl.
*H01L 23/52* (2006.01)
(52) U.S. Cl.
USPC .......................... 257/211; 257/296

(58) Field of Classification Search
USPC .................................................. 257/211, 296
See application file for complete search history.

(56) References Cited

U.S. PATENT DOCUMENTS

| 6,255,151 | B1 | 7/2001 | Fukuda et al. |
| 6,965,139 | B2 | 11/2005 | Ohno |
| 6,984,861 | B2 | 1/2006 | Yamada et al. |
| 2003/0052350 | A1 | 3/2003 | Ohno |
| 2005/0023589 | A1 | 2/2005 | Yamada et al. |

FOREIGN PATENT DOCUMENTS

| JP | 11-186518 | 7/1999 |
| JP | 2000-332216 | 11/2000 |
| JP | 2005-044972 | 2/2005 |

*Primary Examiner* — Douglas Menz
(74) *Attorney, Agent, or Firm* — Young & Thompson

(57) ABSTRACT

To provide a structure of a semiconductor device that realizes an increase in a capacitor capacitance of a memory circuit to the maximum while inhibiting an increase in a contact resistance of a logic circuit, and a manufacture method thereof. When designating the number of layers of the local interconnect layers having wiring that makes up a logic circuit area as M and designating the number of layers of the local interconnect layers having wiring that makes up the memory circuit as N (M and N are natural numbers and satisfy M>N), capacitance elements are provided over the interconnect layers comprised of (M−N) layers or (M−N+1) layers.

17 Claims, 10 Drawing Sheets

SEMICONDUCTOR DEVICE AND METHOD FOR MANUFACTURING THE SAME

CROSS-REFERENCE TO RELATED APPLICATIONS

The disclosure of Japanese Patent Application No. 2010-027974 filed on Feb. 10, 2010 including the specification, drawings and abstract is incorporated herein by reference in its entirety.

BACKGROUND

1. Field of the Invention

The present invention relates to a semiconductor device and a method for manufacturing the semiconductor device.

2. Description of Related Art

DRAM (Dynamic Random Access Memory) includes a multitude of unit memory cells each made up of one capacitor and one transistor. Reading and writing to the memory cells is effected using word lines that are coupled to the gates of the transistors and bit lines that are coupled to the sources and drains thereof. These devices also include peripheral circuits for selection, reading, and writing.

Semiconductor devices now often include on a common substrate a memory circuit area for DRAM including memory cells and peripheral circuits as described above, as well as a logic circuit area accommodating logic circuits that perform operations other than memory operations. Such devices are sometimes referred to as embedded DRAM or eDRAM, and they can provide large-capacity and high-speed memory on a comparatively small chip. For eDRAM, high speed performance is considered even more important than for general purpose DRAM, because the logic circuitry must be able to operate faster than is normally needed for stand-alone DRAM.

Japanese Kokai No. 2005-044972 describes a memory element having ferroelectric capacitors occupying the same insulating film as multilayer interconnect layers.

Japanese Kokai No. 2000-332216 discloses adding a single layer to the interconnect layer in the peripheral circuit part to reduce a step between the memory part and a peripheral circuit part.

Japanese Kokai No. Heill(1999)-186518 seeks to reduce a resistance at the portion of a contact hole between first and second layer interconnections used for making a high aspect ratio three dimensional capacitor.

SUMMARY

Semiconductor devices including embedded DRAM having both memory circuits and logic circuits often require a given defined cell capacitance notwithstanding ongoing miniaturization of overall device dimensions, which leads to an increase in capacitor height as miniaturization progresses. However, when a tall metal-insulator-metal (MIM) capacitor is used in embedded DRAM, the thickness of the surrounding insulating film is correspondingly increased. Given that the insulating films of eDRAM are typically formed simultaneously in the memory and logic sections using CMOS technology, this results in an increase in contact length, and hence contact resistance, in the logic section of the eDRAM, especially when the eDRAM has a multilayered interconnect structure. In particular, the increased resistance of a contact coupled between elements in lower layers and interconnect layers and MIM capacitors in higher layers hinders high speed operation of the semiconductor device.

According to one aspect of the present invention, there is provided a semiconductor device which comprises:

a substrate including a memory circuit area and a logic circuit area;

a memory element formed in the memory circuit area;

a multilayer local interconnect layer formed in the memory circuit area by stacking N insulator layers where each insulator layer has an interconnect and a contact or via; and a multilayer local interconnect layer formed in the logic circuit area by stacking M insulator layers where each insulator layer has an interconnect and a contact or via, wherein the memory element is formed in a multilayer local interconnect layer comprised of (M−N) layers or (M−N+1) layers (M and N are natural numbers and satisfy M>N and N≧2) so that a height of the memory element and a height of (M−N) layers or (M−N+1) layers are same height.

According to another aspect of the present invention, there is provided a method for manufacturing a semiconductor device including a memory circuit area and a logic circuit area which comprises:

when the number of insulator layers forming a multilayer local interconnect layer formed in the logic circuit area is M and the number of insulator layers forming a multilayer local interconnect layer formed in the memory cell area is N (M and N are natural numbers and satisfy M>N);

forming a bit line which is one of a local interconnect in the memory circuit area;

forming local interconnect layers comprised of (M−N+1) layers in the logic circuit area;

forming a memory element so that a height of the memory element and a height of the (M−N+1) layers is same height; and forming remaining local interconnect layers over the local interconnect layers and over the memory elements.

According to still another aspect of the present invention, there is provided a method for manufacturing a semiconductor device including a memory circuit area and a logic circuit area which comprises:

when the number of insulator layers forming a multilayer local interconnect layer formed in the logic circuit area is M and the number of insulator layers forming a multilayer local interconnect layer formed in the memory cell area is N (M and N are natural numbers and satisfy M>N);

forming a first local interconnect layer in the memory circuit area and the logic circuit area;

forming local interconnect layers comprised of (M−N) layers in the logic circuit area;

forming a memory element so that a height of the memory element and a height of the (M−N) layers is same height; and forming remaining local interconnect layers over the local interconnect layers and over the memory elements.

Then, in the present invention, in the case where the number of layers M of the local interconnect layers of the logic circuit is set to an upper limit of the number of the whole local interconnect layers, the height of the capacitance element is raised by utilizing a space of (M−N) layers or (M−N+1) layers (a space of the stacking direction of the interconnect layers), wherein (M−N) is obtained by subtracting the number of layers N of the local interconnect layers of the memory circuit from the number of layers M of the interconnect layers of the logic circuit. For this reason, even if the memory circuit is miniaturized, the height of the capacitance element of the memory circuit can be raised even if the structure of the interconnect layer of the logic circuit is not altered. Therefore, in the present invention, it is possible to increase the capacitor capacitance of the memory circuit to the maximum while inhibiting the increase in a resistance of the contact of the logic circuit.

DETAILED DESCRIPTION OF THE PREFERRED EMBODIMENTS

Figure 1:
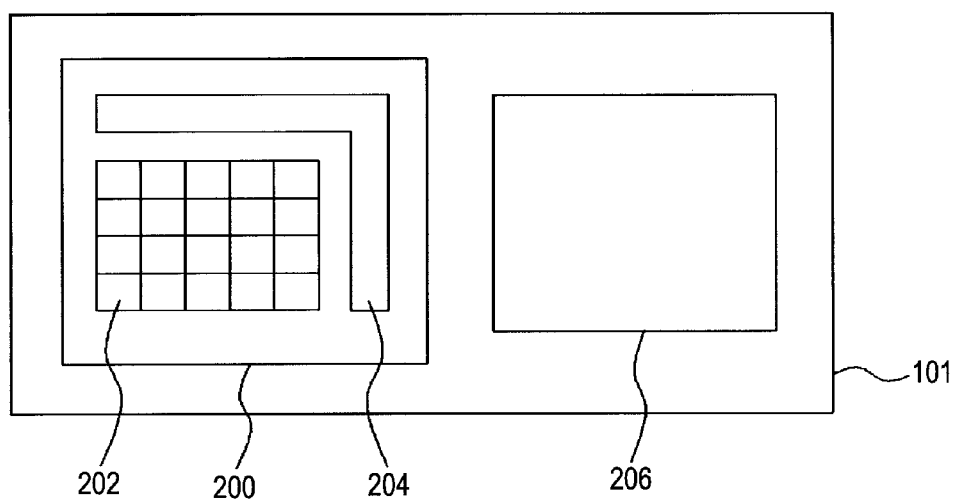
FIG. 1 is a top view schematically showing a semiconductor device in an embodiment of the present invention.

Hereafter, embodiments of the present invention will be explained using drawings. Incidentally, in all the drawings, like reference numerals are given to similar components and their explanations are omitted suitably.

First Embodiment

Figure 2:
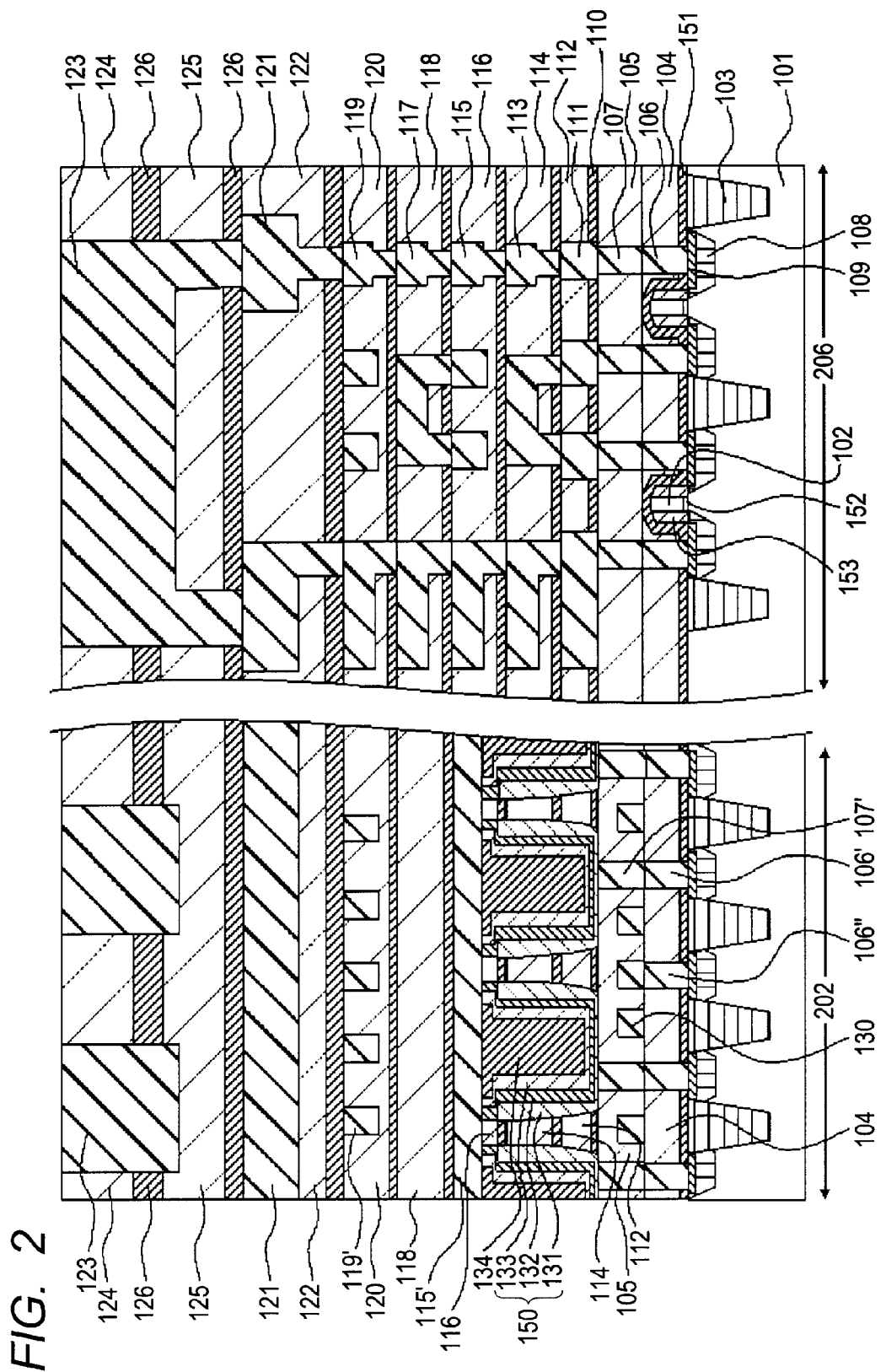
FIG. 2 is a sectional view showing a semiconductor device in a first embodiment of the present invention.
Figure 3:
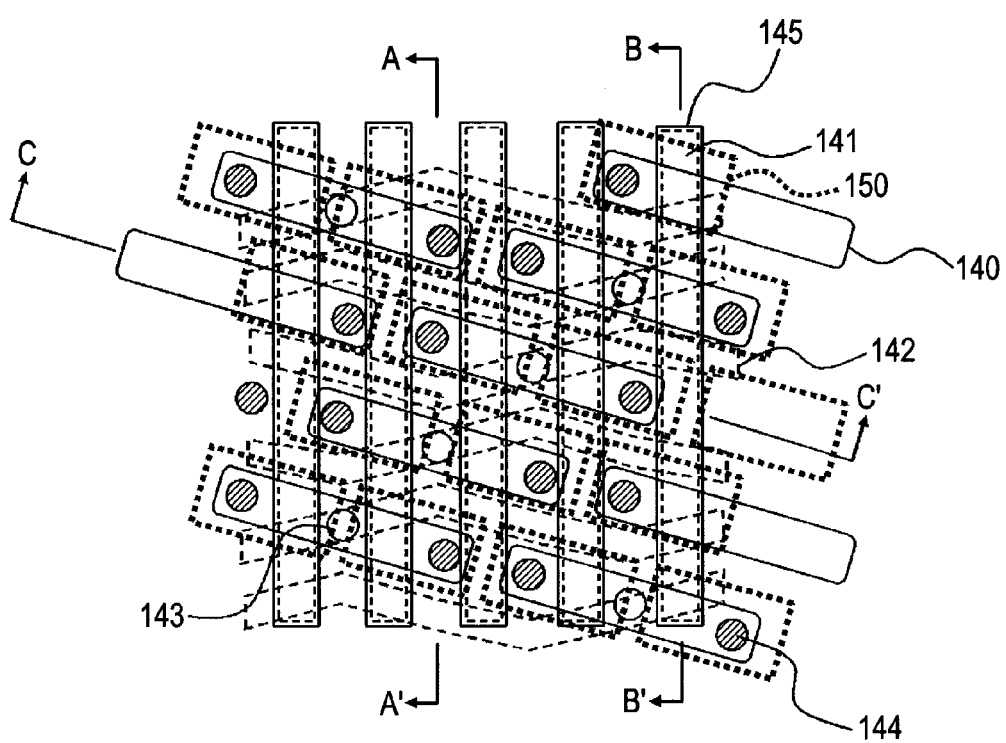
FIG. 3 is a top view schematically showing a memory circuit area of the semiconductor device in the embodiment of the present invention.
Figure 4:
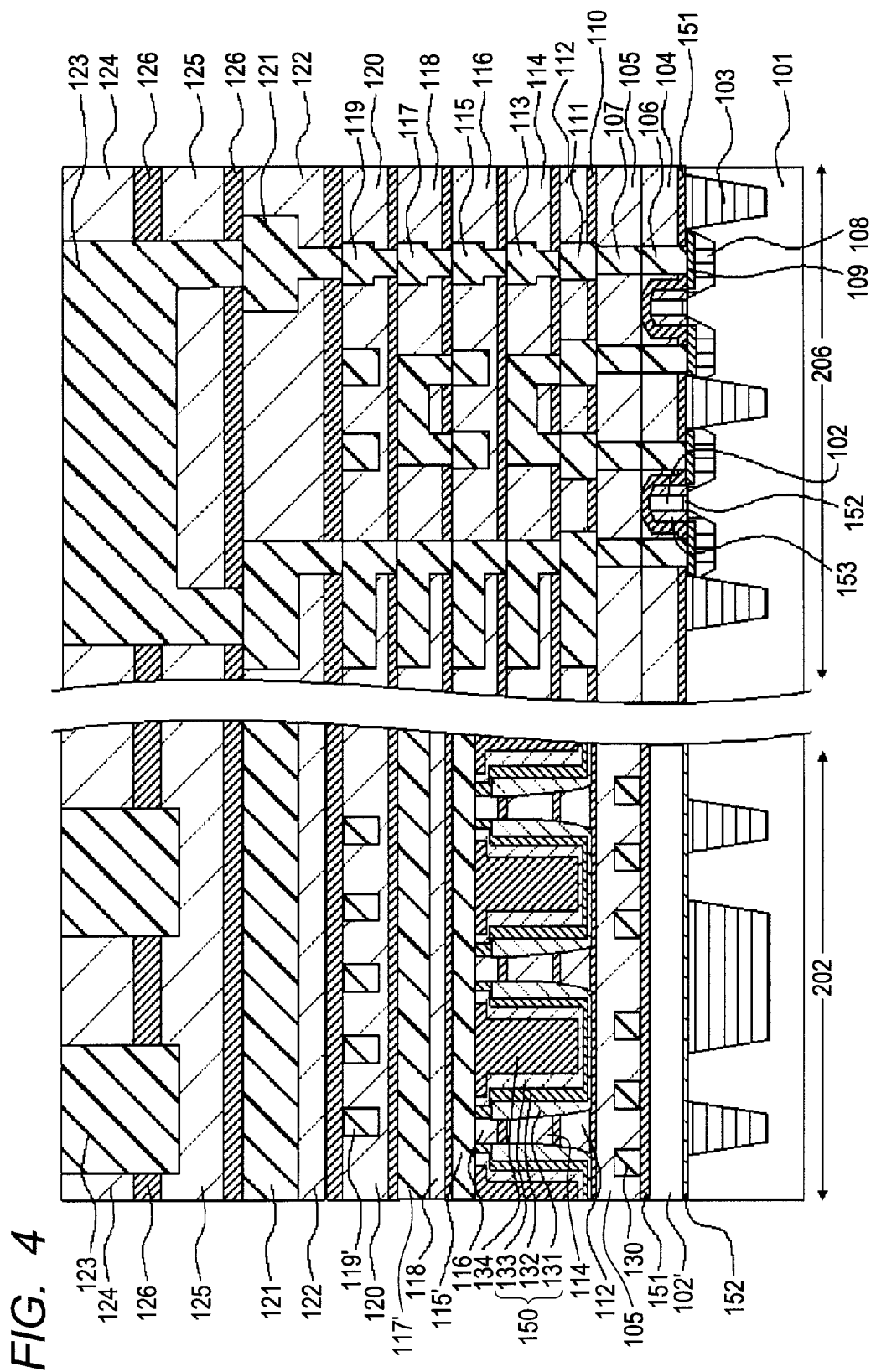
FIG. 4 is a sectional view showing the semiconductor device in the first embodiment of the present invention.
Figure 5:
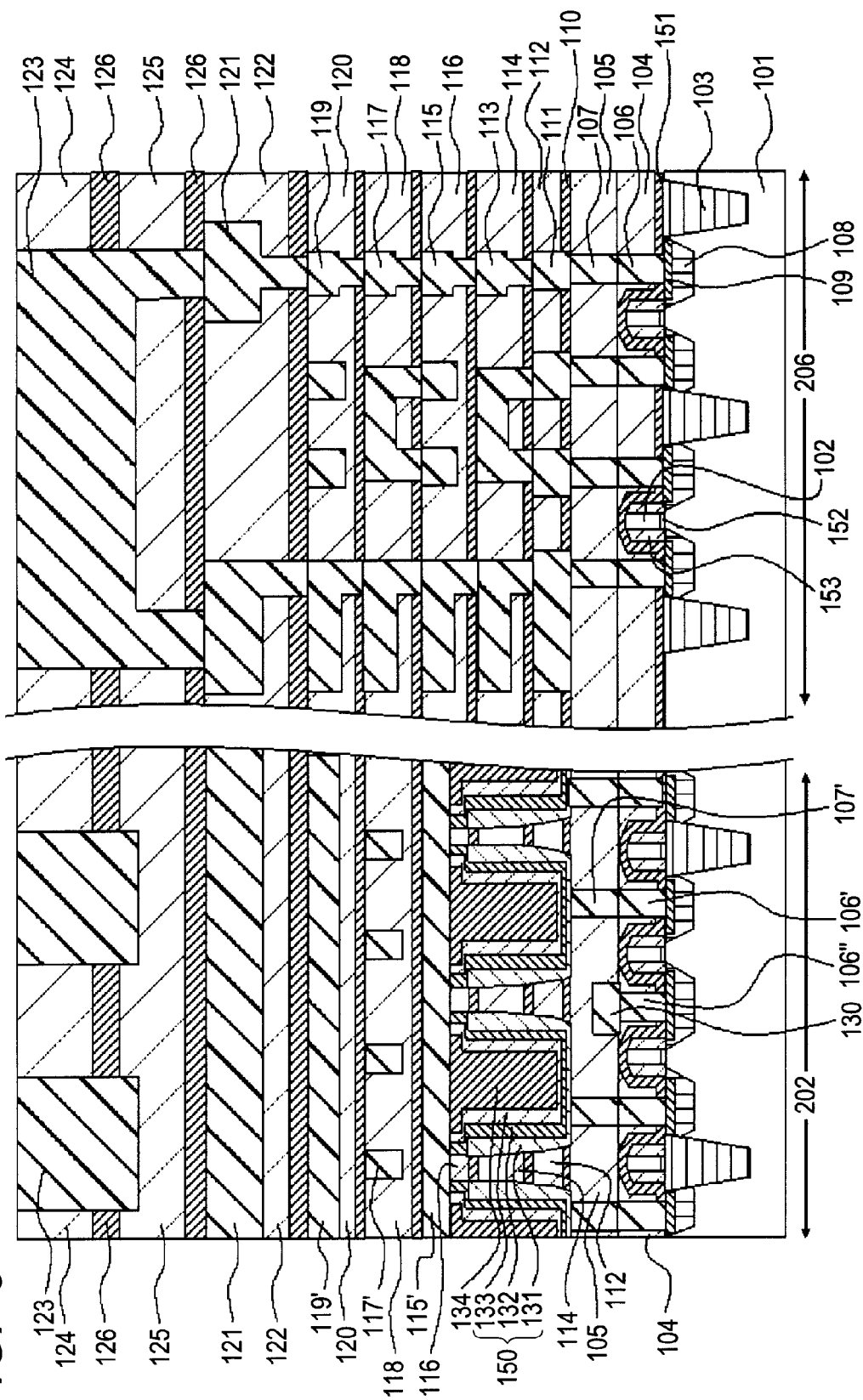
FIG. 5 is a sectional view showing the semiconductor device in the first embodiment of the present invention.

FIG. 1 is a top view schematically showing a semiconductor device in this embodiment. FIG. 3 is a top view schematically showing a memory circuit area of the semiconductor device in this embodiment. FIG. 2, FIG. 4, and FIG. 5 are sectional views showing a configuration of the semiconductor device in this embodiment when seeing from an A-A' cross section direction, a B-B' cross section direction, and a C-C' cross section direction in FIG. 3, respectively.

The semiconductor device of this embodiment includes: multilayer local interconnect layers that are formed over a substrate (a silicon substrate 101) and are made by stacking a plurality of interconnect layers each made up of wiring and an insulating layer; a memory cell area 202 that is formed in a memory circuit area 200 provided within the silicon substrate 101 in plan view and has memory elements (capacitance elements 150) embedded in the multilayer local interconnect layers; a peripheral circuit 204 (an input/output circuit area) that is formed in the memory circuit area 200 and controls the capacitance elements 150; and a logic circuit that is formed in a logic circuit area 206 being an area different from the memory circuit area within the silicon substrate 101 in plan view and has transistors; wherein designating the number of layers of the local interconnect layers having wiring that makes up a logic circuit as M and designating the number of layers of the local interconnect layers having wiring that makes up a memory circuit as N (M and N are natural numbers and satisfy M>N), the capacitance elements 150 are provided over the local interconnect layers comprised of (M−N) layers or (M−N+1) layers.

In this application, an area where the unit memory cells congregate is described as a memory cell area, and the whole area including the peripheral circuits for selection, reading, and writing is described as a memory circuit area.

In this embodiment, a number that is the number of layers of the local interconnect layers of the logic circuit added with one layer of a bit line of the memory circuit area 200 is set to an upper limit of the number of the whole local interconnect layers. Therefore, a space of (M−N+1) layers that is the number of layers in the case where the interconnect layers of the logic circuit is set to a necessary minimum number added with one layer of the local interconnect layer having the bit line of the memory circuit area and subtracted with the number of layers N of the local interconnect layers of the memory cell area 202 can be used for a space for a capacitance element 150. For this reason, the height of the capacitance element 150 can be raised up to a maximum value equal to the interconnect layers comprised of (M−N+1) layers. Consequently, even if the memory circuit is miniaturized, the height of the capacitance element 150 of the memory cell area 202 can be raised, without raising a contact height of the logic circuit. Therefore, in this embodiment, it is possible to increase the capacitor capacitance of the memory cell area 202 to the maximum while inhibiting an increase in resistance of a contact of the logic circuit.

Here, the case where the space of (M−N+1) layers is used is a case where the bit line is formed to be lower than the capacitance element of the memory circuit area 200 with a material different from a wiring material used in the logic circuit area 206.

Here, in the interconnect layer described in this specification, (at least one) long and slender structure that is conductive to allow a current to flow or to conduct an electric potential between separated areas in that layer exists, a conductive area(s) is provided in a lower layer or upper layer (or in the both layers) through an interlayer insulating layer, and the structure has a function of coupling conductors of different lower layers, or between conductors of different upper layers, or between conductors of the lower layer and the upper layer (through the contact formed in the interlayer film). The conductive area formed over the under layer or upper layer thereof is, for example, a source-drain (silicide) area, a gate electrode layer, a lower layer interconnect layer, an upper layer interconnect layer, a bonding area, etc. Although, a gate electrode layer (including a silicide layer or germanide layer on its surface), a surface silicide layer (or germanide layer) formed on the substrate semiconductor surface, a low resistance layer formed on the substrate semiconductor surface, etc. may become layers that agree with the above-mentioned definition. However, in order to exactly express an idea of the present invention, they are excluded from the object called wiring in this specification. Therefore, in addition to the gate electrode layer (a layer that is making contact with the semiconductor channel through the gate insulating film), the following layers are not included in the object that is described as the interconnect layer in this application: a layer obtained by siliciding or germaniding the surface of the semiconductor substrate and the surface of the semiconductor gate electrode; the contact (however, in the case where the interconnect layer and the contact layer are formed as one body like dual damascene, the layer becomes naturally the interconnect layer because it includes the wiring layer); a layer on which something like a bonding pad is formed; etc.

As shown in FIG. 1, the semiconductor device of this embodiment has a configuration in which the memory circuit area 200 including the memory cell area 202 and the logic circuit area 206 in which semiconductor elements are formed are mounted together. The logic circuit area 206 is not formed in the peripheral circuit 204 of the memory elements (the memory cell area 202) in the memory circuit area 200 but formed in an area different from the memory circuit area 200. For example, the logic circuit area can be specified as an area in which a high-speed logic circuit, such as a CPU (Central Processing Unit), is formed.

Moreover, the semiconductor device of this embodiment may have an unillustrated SRAM area over the semiconductor substrate (the silicon substrate 101) on which the memory circuit area 200 and the logic circuit area 206 were mounted together.

The number of layers of the interconnect layers in which wiring that makes up the logic circuit is formed may be specified as 6 to 13 layers. For example, in high-speed logic circuits, such as a CPU, the number of layers of the interconnect layers can be specified as 8 to 13 layers. A value obtained by subtracting the number of layers of semi-global wiring and global wiring from the number of layers of these interconnect layers becomes the number of layers M of the local interconnect layers of the logic circuit area 206.

On the other hand, the number of layers of the interconnect layers in which wiring makes up the memory cell area 202 can be specified, for example, as 3 to 7 layers. If the interconnect layers is in this range of the number of layers, the memory cell area 202 can store information to be stored. The number of layers N of this interconnect layer is determined by the operating speed and capacity of the DRAM. A value that is the number of layers of this interconnect layer from which the numbers of layers of the semi-global wiring and the global wiring are subtracted becomes the number of layers N of the local interconnect layers of the memory cell area 202.

Incidentally, in this embodiment, the local interconnection (the bit line) formed only in the memory cell area 202 exists. For this reason, the number of the local interconnect layers that is an addition of the memory circuit area 200 and the logic circuit area 206 becomes M+1.

In the logic circuit area 206 of this embodiment, an example of multilayer interconnect layers that are comprised of five layers of local interconnect layers, one layer of semi-global interconnect layer and two layers of global interconnect layers. Thicknesses of the interconnect layers and wiring that make up this multilayer interconnect layers are not limited in particular. A part of or the whole of the thicknesses of the interconnect layers and wiring of the multilayer interconnect layers may be the same, or the thicknesses of the interconnect layers and wiring of the multilayer interconnect layers may be tapered to have a thicker thickness from the lower layer toward the upper layer. Since there exists the local interconnection (the bit line) formed with a material different from that of the logic circuit area 206 in the memory circuit area 200, the number of interconnect layers that is an addition of those in the logic circuit area 206 and in the memory circuit area 200 becomes nine layers.

First, a structure of the logic circuit area 206 according to this embodiment will be explained using FIG. 2.

Semiconductor devices (transistors) are provided over the silicon substrate 101, and these transistors are separated by element isolation areas 103. This transistor is comprised of a gate insulating film 152 and a gate electrode 102 that are provided over the silicon substrate 101, and a diffusion layer 108 provided near a surface of the silicon substrate 101 on both sides of the gate electrode 102. The diffusion layer 108 functions as source and drain. A sidewall 153 is provided over a side wall of the gate electrode 102. Moreover, an etching stopper film 151, a first contact insulating layer 104, and a second contact insulating layer 105 are provided over the transistor.

Furthermore, a first contact 106 and a second contact 107 are provided in the first contact insulating layer 104 and the second contact insulating layer 105, respectively. These contacts are made up of tungsten (W), for example. The first contact 106 couples with the diffusion layer 108. Then, a silicide layer 109 is provided near a surface of the diffusion layer 108 contacting with the first contact 106.

On the second contact insulating layer 105, five layers of the local interconnect layers are provided. That is, the local interconnect layers are comprised of: first wiring 111 and a first local interconnect insulating layer 112, second wiring 113 and a second local interconnect insulating layer 114, third wiring 115 and a third local interconnect insulating layer 116, fourth wiring 117 and a fourth local interconnect insulating layer 118, and fifth wiring 119 and a fifth local interconnect insulating layer 120. An etching stopper film 110 is provided between the respective interconnect layers.

Moreover, over the fifth local interconnect insulating layer 120, the semi-global interconnect layer and the global interconnect layer are provided. The semi-global interconnect layer is comprised of sixth wiring 121 and a semi-global interconnect insulating layer 122. The global interconnect layer is comprised of a first global interconnect insulating layer 123, a second global interconnect insulating layer 124, and a global interconnect layer 123 provided over these insulating layers. Moreover, an etching stopper film 126 is provided between the respective interconnect layers.

Here, the multilayer interconnect layers have the local interconnect layers and the global interconnect layer formed over the local interconnect layers.

The local interconnect layers means an interconnect layer that is closest to the semiconductor substrate (the silicon substrate 101) and has at least one piece of wiring with a minimum pitch comparable (1.1 times of the following pitch at large) to the minimum pitch of the wiring (a pitch of its line part). The wiring width of the local interconnection that makes up this local interconnect layers usually becomes about 100 μm at the longest. The local interconnection in each area (for example, the memory circuit area 200 or the logic circuit area 206) is defined based on a minimum pitch of the writing closest to the semiconductor substrate in the area, and in the case where design rules of different areas over the chip are different, the width of the local interconnection will have a different value in each area.

The multilayer local interconnect layers are formed by repeatedly stacking an interconnect layer in which wiring is embedded in a first insulating layer and a contact layer in which a contact or via is embedded in a second insulating layer.

In the local interconnect layers located in the memory circuit area 200, interconnection (local interconnection) for coupling various elements making up the memory cell area 202 mutually to configure the memory cell area 202 is formed, and in each interconnect layer of the local interconnect layers located in the memory circuit area 200, at least one of the capacitance element 150 and interconnection (local interconnection) making up the memory cell area 202 is provided.

On the other hand, in the local interconnect layers located in the logic circuit area 206, wiring for coupling various elements making up the logic circuit mutually to configure the logic circuit is formed, and in each interconnect layer of the local interconnect layers located in the logic circuit area 206, interconnection (local interconnection) making up the logic circuit is provided.

Such local interconnection extends only within the memory circuit area 200, or extends only within the logic circuit area 206.

Moreover, in the global interconnect layer, a power supply line (global wiring 123 and the sixth wiring 121) for supplying electric power to the memory cell area 202 and the logic circuit are formed. The global wiring (including the semi-global wiring) in the global interconnect layer mutually couples functional blocks, such as a first functional block that is comprised of a group of memory elements and a second functional block that is comprised of a group of transistors. For example, in this embodiment, the global wiring couples the memory cell area 202 and the logic circuit area 206. These pieces of wiring become metallic wiring with a wide wiring width and a thick film thickness.

On the other hand, a structure of the memory cell area 202 according to this embodiment will be explained in detail using FIG. 2. A cross-sectional structure of the memory cell area 202 shown in FIG. 2 corresponds to an A-A' section of FIG. 3.

As shown in FIG. 2, in the memory circuit area 200, either of the capacitance element 150 or the wiring that makes up the memory cell area 202 is provided in each layer of the local interconnect layers. On the other hand, in the logic circuit area 206, the wiring that makes up the logic circuit is provided in each layer of the local interconnect layers. In other words, in the local interconnect layers in plan view, the capacitance element 150 or the local interconnection that makes up the memory cell area 202 exists in the memory cell area 202, and on the other hand, the local interconnection that makes up the logic circuit area 206 exists in the logic circuit area 206.

The insulating layers in the multilayer interconnect layers in the memory circuit area 200 are comprised of eight layers: the first local interconnect insulating layer 112, the second local interconnect insulating layer 114 and a second global interconnect insulating layer 125, similarly with the logic circuit area 206. On the other hand, three of the interconnect layers of the multilayer interconnect layers in the memory circuit area 200 are assigned to the global wiring 123 and the sixth wiring 121 (semi-global wiring) as power supply wiring similarly with the logic circuit area 206. Moreover, two of the local interconnect layers are assigned as word shunt line 117' (not illustrated) and a global bit line 119'. Then, remaining three local interconnect layers are assigned as the interconnect layers used in order to embed the capacitance element 150 over three layers.

Below, pieces of wiring that make up the memory cell area 202 will be explained.

In this embodiment, the number of local interconnections that need to be arranged over the memory cell area 202 can be specified to be at least three, for example. One is a bit line 130, another one is the word shunt line 117', and further another one is the global bit line 119'.

[About the Word Shunt Line 117']

As shown in FIG. 3, a diffusion layer 140, a word line 141 (=a selection transistor), a bit line 142, a bit contact 143, and a capacitor contact 144 are provided over the silicon substrate 101. Although not illustrated in FIG. 3, an element isolation area is provided between the diffusion layers 140. Moreover, the memory element is provided in the insulating layer that is on the top of the capacitor contact 144.

Next, as shown in FIG. 3, a gate electrode of the selection transistor is used as the word line 141. The gate electrode of a Si transistor currently used is often formed with a stacked structure of a polycrystalline silicon layer containing an n-type dopant in a high concentration and a silicide layer. Such a gate electrode has a high resistance compared with a metallic film. Therefore, in the large capacity memory usually used, a voltage drop may arise along the word line 141.

Therefore, in this embodiment, a metal interconnect layer that has the same pitch as the word line and a low electric resistance is placed so as to contact with the gate electrode at a suitable interval through the contact. Thus, the gate electrode acting as the word line 141 can be electrically coupled to the Tr with metallic wiring whose electric resistance is low. For this reason, the voltage drop described above can be inhibited. In the specification of this application, such a metallic interconnect layer is called word shunt line. As shown in FIG. 3, word shunt line 145 is placed right above the word line 141.

Moreover, as shown in FIG. 4 and FIG. 5, the word shunt line 117' is provided right above a word line 102' (a gate electrode of the selection transistor). The word shunt line 117' and the word line 102' are coupled with each other with a suitable interval such as at an end of a memory cell block. This word shunt line 117' corresponds to the word shunt line 145 of FIG. 3, and the word line 102' corresponds to the word line 141 of FIG. 3.

[About the Global Bit Line 119']

As shown in FIG. 4 and FIG. 5, the global bit line 119' is provided in a fifth interconnect layer over the DRAM (the capacitance element 150).

Here, one bit of the DRAM is comprised of a single transistor (hereinafter, abbreviated as Tr) and a single capacitor. This DRAM is coupled to the word line for turning on/off the Tr and the bit line for inputting/outputting data into/from the DRAM. In addition, the global bit line 119' is used to output a signal of the sense amplifier to an IO bus and other purposes.

These pieces of wiring of the word shunt line 117', the global bit line 119', etc. are such that a required current density needs to be small and these need to be arranged with a dense pitch. Therefore, all of these pieces of wiring can be made up of the local interconnection. The local interconnection is metal wiring formed in general by a minimum design rule for higher integration. The local interconnection is formed to have a maximum length of about 100 μm. The local interconnection is often placed in a comparatively lower layer of multilayer wiring.

Next, a method for manufacturing a semiconductor device according to this embodiment will be described.

This method for manufacturing a semiconductor device is a manufacture method of a semiconductor device that includes multilayer local interconnect layers that are formed over a substrate (silicon substrate 101) and are made by stacking a plurality of layers each made up of wiring and an insulating layer, the memory cell area 202 that is formed in the memory circuit area 200 provided within the silicon substrate 101 in plan view and has memory elements (capacitance elements 150) embedded in the multilayer interconnect layers, a peripheral circuit 204 that is formed in the memory circuit area 200 and controls the capacitance elements 150, and a logic circuit that is formed in the logic circuit area 206 being an area different form the memory circuit area 200 within the silicon substrate 101 in plan view and has transistors, comprising the steps of: when designating the number of layers of the local interconnect layers that make up the logic circuit area as M and designating the number of layers of the local interconnect layers that make up the memory cell area as N (M and N are natural numbers and satisfy M>N), forming the bit line 130 that is the local interconnection; forming the local interconnection comprised of (M−N+1) layers in the logic circuit area 206; forming the capacitance element 150 over the local interconnect layers comprised of (M−N+1) layers in the memory circuit area 200; after the steps above, further forming the local interconnect layers comprised of the remaining (N−1) layers over the local interconnect layers and over the capacitance element 150.

First, the first contact insulating layer 104 and a connection hole are formed over the semiconductor substrate (the silicon substrate 101) on which elements, such as a transistor, were formed. The contacts (the first contact 106, a first capacitor contact 106', a bit contact 106") are formed to embed this connection hole. Subsequently, the contacts (the second contact 107, a second capacitor contact 107') are formed, and then the bit line 130 is formed. After this, the second contact insulating layer 105 is formed to embed these, and this insulating layer is flattened by CMP (Chemical Mechanical Polishing).

For example, any film having insulation such as a silicon oxide film can be used as the insulating layer, and it can be a monolayer or multilayer. Moreover, as the insulating layer, a porous insulating film whose relative dielectric constant is lower layer than that of a silicon oxide film (whose relative dielectric constant is about 3.9 to 4.0). As porous insulating films, there are, for example, a porous silica material obtained by making a silicon oxide film porous to reduce the relative dielectric constant, an HSQ (Hydrogen Silsesquioxane) film, and materials of SiOCH, SiOC (i.e., Black Diamond™, Aurora™), etc. that are made porous to reduce the relative dielectric constant, and the like.

In this embodiment, a metallic wiring material and a contact plug material can be specified to be mainly Cu as a principal component. In order to improve reliability of the metallic wiring material, metallic elements other than Cu may be contained in a substance made of Cu, and metallic elements other than Cu may be formed on a top face, a side face, etc. of Cu. Moreover, in a part of the embodiments, the contact plug material in the first contact insulating layer 104 and the second contact insulating layer 105 can be tungsten (W) as the principal component.

Furthermore, for the material of the bit line 130, any material selected from the group of tungsten, aluminum, titanium, titanium nitride, tantalum, and tantalum nitride can be used as the principal component.

Here, in this embodiment, tungsten (W) is used as the contact and the bit line 130, for example.

Subsequently, the interconnect layers comprised of (M−N+1) layers in the logic circuit area 206 are formed.

A silicon nitride film (the etching stopper film 110) and a silicon oxide film (the first local interconnect insulating layer 112) are formed over the second contact insulating layer 105. Subsequently, a silicon oxide film is formed as a mask. An opening part for the wiring (the first wiring 111) is formed by a so-called dual damascene method that uses lithography and dry etching. At this time, a part of the opening part includes a via hole for electrically coupling to lower layer wiring or the contact. A barrier metal film is deposited on these opening parts by a spattering method, and subsequently copper serving as a seed layer of copper plating is deposited. Furthermore, copper is embedded by a plating method. This copper material may contain metallic additives, such as aluminum and silver. Excessive barrier metal film and copper are removed using a technique of CMP etc. so that the barrier metal film and copper may remain in this opening part for the first wiring 111 to form the first wiring 111. During this process, the above-mentioned silicon oxide (the mask) is removed, and does not remain over the first local interconnect insulating layer 112. After that, the etching stopper film 110 is formed over the first local interconnect insulating layer 112. By the above process, a first interconnect layer is formed.

The barrier metal film shows a conductive film that covers a side face and a bottom face of the wiring and has a property of acting as a barrier against diffusion of copper in order to prevent metallic elements making up the wiring or a contact plug from diffusing into an interlayer insulating film and a lower layer. For example, in the case where the wiring is made of metal elements including Cu as a principal component, high melting point metals and their nitrides, such as tantalum (Ta), tantalum nitride (TaN), titanium (Ti), titanium nitride (TiN), tungsten carbonitride (WCN), and ruthenium (Ru), or and their stacked films are used. Moreover, the metallic film is used also for a barrier metal of the contact plug that uses tungsten for the principal component.

The wiring can be made up of metallic wiring, such as of Al, AlSi, AlSiCu, AlCu, and Cu. In this embodiment, Cu wiring is used as the wiring, for example.

After the first interconnect layer is formed, a second interconnect layer is formed by the same process as a formation method of the first interconnect layer. Here, in order to form the capacitance element 150 in the memory circuit area 200, wiring of the first and second interconnect layers is formed only in the logic circuit area 206.

After this, in the memory circuit area 200, a portion of the insulating layer of a third interconnect layer (for example, corresponding to a thickness of about half of the third local interconnect insulating layer 116) is formed, and subsequently a cylinder shaped opening part for the capacitance element 150 is formed over a part from the first interconnect layer to the third interconnect layer. Subsequently, a bottom electrode film 131 is deposited at least over the bottom face and over the side wall of the opening part. Subsequently, the bottom electrode film 131 in the opening part is protected by resist, and is processed by etch back so that the bottom electrode film 131 may be left only over the bottom face and over the side wall of the opening part. After removing the resist, a capacitance insulating film 132 is deposited so that it may cover the surface of this bottom electrode film 131. Subsequently, an upper electrode film 133 is formed along the inside of the capacitance insulating film 132, and the opening part is embedded with a metallic film 134 (W). Subsequently, a flattening processing and removal are performed by the CMP method. Here, a process of forming the capacitance element 150 can be performed, for example, at not more than 350° C. As the film forming method, a CVD method can be used, for example. It is desirable to form the capacitance element 150 at not more than 350° C. in order to enhance the reliability of the first interconnect layer and the second interconnect layer.

Here, the capacitance element 150 has an MIM (Metal Insulator Metal) structure. The capacitance element 150 has a cylinder shape. A planar shape of this capacitance element 150 can be a circular shape, an elliptic shape, a rectangular shape, etc. Moreover, a sectional shape of the capacitance element 150 can be a rectangular shape, a tapered shape, barrel shape, etc.

The capacitance element 150 is comprised of the bottom electrode film 131, the capacitance insulating film 132, and the upper electrode film 133. As a material used for the capacitance element 150, there can be enumerated Ti or TiN or its stacked structure for the upper electrode film 133 and the bottom electrode film 131. As the capacitance insulating film 132, there can be enumerated films of $ZrO_2$, $Ta_2O_5$, $HfO_2$, and those films with added lanthanoids, such as Tb, Er, and Yb.

Subsequently, after the insulating layer of the third interconnect layer is deposited additionally, in the logic circuit area 206, the third interconnect layer comprised of the third wiring 115 and the third local interconnect insulating layer 116 is formed by the same process as the formation method of the first interconnect layer. In this step, an upper electrode line 115' (plate line) that couples with the upper electrode film 133 through the metallic film 134 is formed in the memory circuit area 200. This upper electrode line 115' is formed using the third wiring 115. Here, a final film thickness of the third interconnect layer is adjusted so that the memory circuit area 200 and the logic circuit area 206 may have the same film thickness.

Thus, the capacitance elements 150 can be embedded over the interconnect layers comprised of (M−N+1) layers in the memory circuit area 200. In this embodiment, the capacitance elements 150 are provided over the local interconnect layers of three layers.

The upper electrode line 115' (plate line) can be formed right above the capacitance elements 150 so as to contact at least two or more capacitance elements 150. Moreover, a plurality of upper electrode lines 115' can be formed mutually in parallel (in a line and space form). Thereby, when Cu that is provided over the cell and has a large area is processed by CMP, it is possible to prevent this Cu from suffering from dishing. Furthermore, it is possible for the space width of the upper electrode line 115' to be set smaller than a cylinder-shaped opening width. Thereby, when misalignment occurs, it is possible to inhibit the upper electrode line 115' from being formed at a position away from the opening part for the capacitance element 150.

A planar shape of the upper electrode line 115' may be a mesh-like shape etc. instead of the stripe-like shape. A mesh of this mesh-like shape may be in a rectangular shape or may be in a circular shape.

After this, by repeating a series of steps shown in the method for forming the first interconnect layer, remaining multilayer local interconnect layers can be formed. Then, it is configured so that the number of layers of the semi-global wiring and the global wiring of the memory circuit area 200 and the number of layers of the semi-global wiring and the global wiring of the logic circuit area 206 may become the same. From the above process, the semiconductor device of this embodiment can be acquired.

Next, the operation and effect of the semiconductor device of this embodiment will be explained.

In the eDRAM of this embodiment, when designating the number of layers of the local interconnect layers in which wiring that makes up the logic circuit area is formed as M and designating the number of layers of the local interconnect layers in which wiring that makes up the memory cell area 202 is formed as N (M and N are natural numbers and satisfy M>N), the memory elements (capacitance elements 150) are provided over the interconnect layers comprised of (M−N+1) layers (in one layer, the bit line that does not exist in the logic circuit part is formed). This interconnect layers of (M−N) layers correspond to an available space equal to a thickness of the remaining interconnect layers that is a thickness of interconnect layers required for operations of the logic circuit from which a thickness of interconnect layers required for operations of the memory cell area 202 is subtracted. It is possible to raise the height of the capacitance element 150 using this remaining space to the maximum. For this reason, even if the memory circuit is highly densified (miniaturized), the height of the capacitance element 150 of the memory cell area 202 can be raised, without raising the contact height of the logic circuit. Therefore, in this embodiment, it is possible to at least maintain the capacitor capacitance of the memory circuit, or further to increase it to the maximum while inhibiting an increase in a parasitic resistance of the contact of the logic circuit.

In addition, since increasing of the contact height of the logic circuit can be spared, increase in a parasitic capacitance between the contacts can also be inhibited. Since increase in the parasitic resistance and parasitic capacitance of the contact can be inhibited, it is possible to realize accelerating of the logic circuit. By the above-mentioned feature, in the eDRAM of this embodiment, coexistence of accelerating and higher density (minimization of a chip size) can be realized.

In the local interconnect layers in plan view, the capacitance element 150 or the local interconnection that makes up the memory cell area 202 exists in the memory cell area 202, and, on the other hand, the local interconnection that makes up the logic circuit area 206 certainly exists in the logic circuit area 206. That is, the space in a thickness direction of the local interconnect layers in which wiring required for operations of the logic circuit was formed can be allotted to the space for the memory elements, or to the space in the thickness direction of the local interconnect layers in which minimum local interconnection required for operations of the memory circuit was formed. Thus, the space in the thickness direction of the local interconnect layers of the logic circuit area can be used for the memory circuit without futility. Therefore, it is not necessary to add the number of layers of the local interconnect layers of the logic circuit in order to provide the memory circuit. Thereby, it is possible to inhibit the parasitic resistance and parasitic capacitance, such as of the wiring (including via) of the logic circuit and the contact, from increasing.

Moreover, in this embodiment, the space in the thickness direction of the local interconnect layers of the memory circuit area is used to the maximum as a space for the capacitance element 150. For this reason, the local interconnection required for operations of the memory circuit is designed to have a minimum wiring number. In other words, in the space in the thickness direction of the local interconnect layers of the memory circuit area, the local interconnection is limited to be two, one for the word shunt line and the other for the global bit line, with the exception of the space for the capacitance element 150. Thereby, in the memory circuit, it is possible to reduce the number of layers of the local interconnect layers that are used as the wiring to the minimum in less as possible. For this reason, in the memory circuit, the total thickness of the local interconnect layers formed by a minimum design rule can be thinned. Therefore, it is possible to inhibit the parasitic resistance and parasitic capacitance of the wiring (including the via), etc. in the memory circuit from increasing.

In this embodiment, the capacitance element can be formed in an interlayer between the local interconnection of the number required for the logic circuit and the local interconnection of the number required to be placed over the memory circuit. This makes it possible for the memory circuit to use a cell library common to the logic circuit with a minimum number of steps. Moreover, exactly as described above, since the increase in the parasitic resistance and parasitic capacitance can be inhibited, it is possible to inhibit an operating frequency of the logic circuit from decreasing.

In the case of forming the Cu interconnect layer by a damascene method, it is desirable that this upper electrode line 115' covers the top of a plurality of capacitance elements 150 in a stripe manner from a viewpoint of inhibiting the dishing at the time of CMP.

In this embodiment, a structure such that the upper electrode line 115' (the plate line) is coupled to the upper electrode film 133 through the metallic film 134 can be acquired. By this upper electrode line 115' coupling the capacitance elements 150, it is possible to reduce an electric resistance between the capacitance elements 150.

For example, it can be set that N is 3 or 4 and the local interconnection that makes up the memory cell area 202 includes the bit, line 130, the upper electrode line 115', the word shunt line 117', and the global bit line 119'. These bit line 130, upper electrode line 115', word shunt line 117', and global bit line 119' can be formed simultaneously with the local interconnection of the logic circuit area 206.

In the technology described in the above-mentioned Japanese Application Publication No. 2005-044972, a portion from the contact in the lowest bottom layer in a peripheral circuit part to the interconnect layer is formed separately and newly after the memory circuit is formed. Therefore, there was a case where a need of enlarging a pattern arose or the contact could not be formed in a proper position in order to avoid detrimental influences, such as out of focus, at the time of contact formation of the lowest bottom layer. Moreover, there was a risk that the metallic wiring remaining on a side of the step of the memory circuit and the contact of a neighboring peripheral circuit may make a short circuit. Furthermore, with the structure of the semiconductor device described in the document, the contact and wiring of the memory circuit and the contact and wiring of the peripheral circuit could not be made common, and as a result there was a case where the number of interconnect layers increased.

On the other hand, in this embodiment, since the interconnect layers of the memory circuit, the peripheral circuit, and the logic circuit are formed simultaneously, it becomes possible to use the common library. Therefore, position displacement, such as of the contact, can be inhibited. Thereby, the above-mentioned short circuit can be prevented. Furthermore, it is possible to prevent an increase in the number of interconnect layers.

In case of the technology described in Japanese Application Publication No. 2005-044972, a metal wiring in a memory circuit area is formed at a pitch denser than that of a gate interconnection. Such structure hinders miniaturization of the memory circuit area. The eDRAM needs highly densified memory circuit area, and the present embodiment enables the eDRAM to be microfabricated.

Second Embodiment

Figure 6:
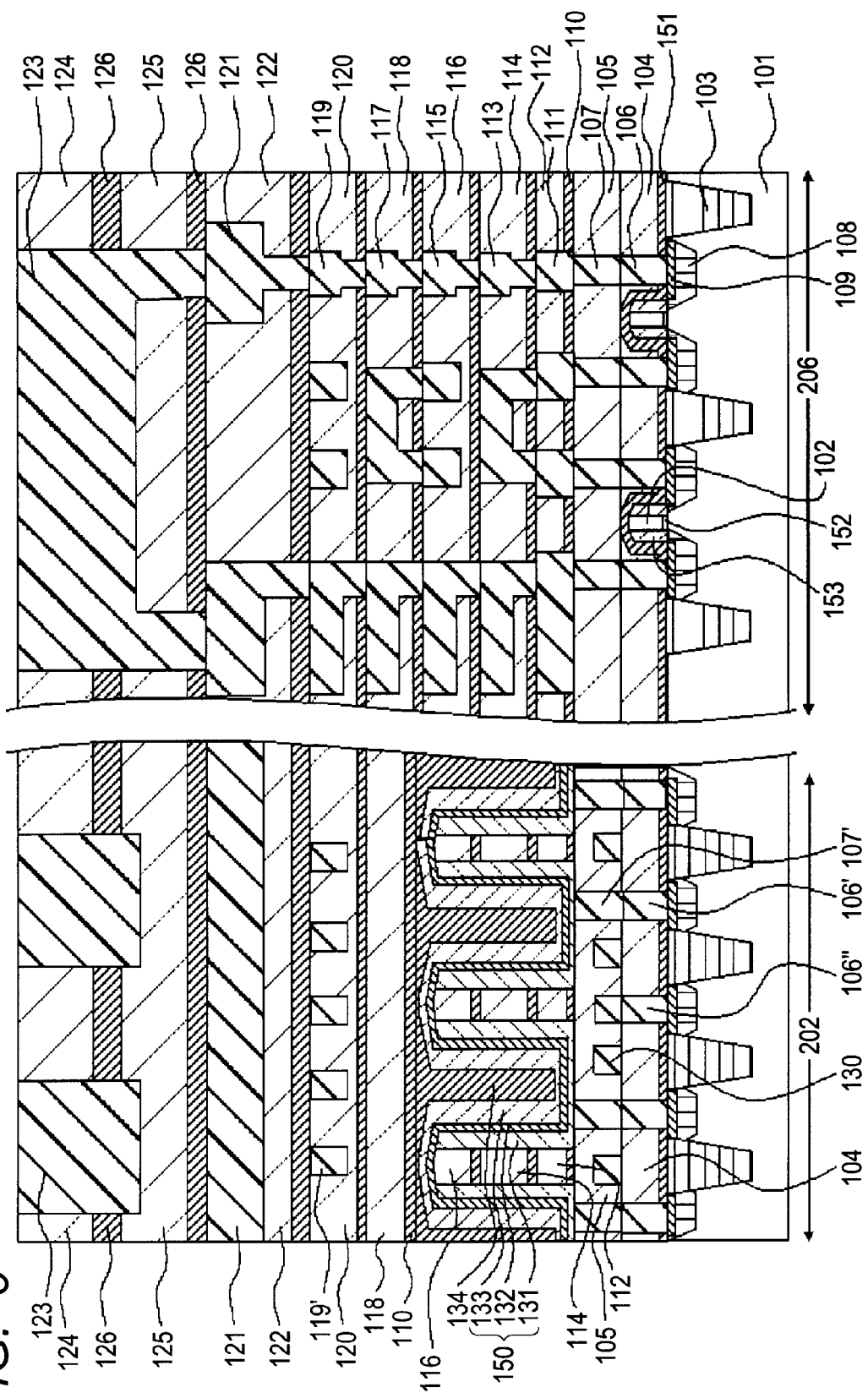
FIG. 6 is a sectional view showing a semiconductor device in a second embodiment of the present invention.
Figure 7:
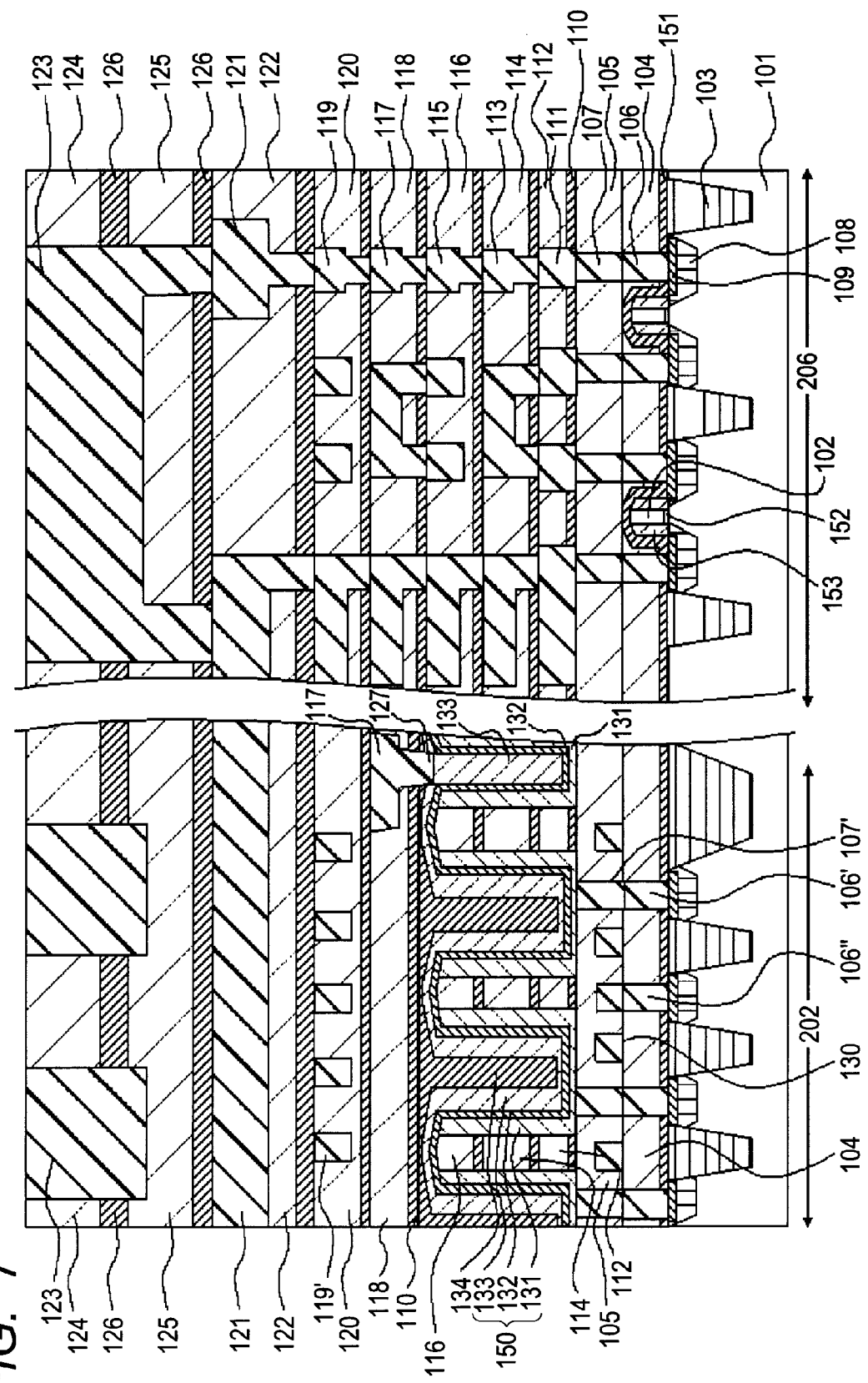
FIG. 7 is a sectional view showing the semiconductor device in the second embodiment of the present invention.

FIG. 6 and FIG. 7 are sectional views showing a semiconductor device in a second embodiment.

As shown in FIG. 6, the second embodiment is different from the first embodiment in a point that the third wiring 115 of the third interconnect layer is not used but a part of the fourth wiring 117 of a fourth interconnect layer is used as an upper electrode line. In addition, in this case, the same effect as the first embodiment can be acquired. The height of the capacitance element 150 can be raised by an amount of one layer by which a position of installation of the upper electrode line becomes higher. Therefore, in the second embodiment, it is possible to increase the capacitance of the capacitance element 150 as compared with the first embodiment.

A manufacturing process of this embodiment will be explained focusing on points different from the first embodiment.

First, the first interconnect layer to the third interconnect layer are formed. Then, a part of the insulating layer that makes up the fourth interconnect layer is formed, and an opening part for the capacitance element 150 is formed in the same manner as the above-mentioned method. Inside this opening part, the bottom electrode film 131, the capacitance insulating film 132, the upper electrode film 133, and the metallic film 134 are formed. This metallic film 134 is processed by etching. Then, a remaining insulating layer that makes up the fourth interconnect layer is deposited additionally.

As shown in FIG. 7, at this time, a dummy capacitance element (a dummy MIM) is provided under a third via 127 of the fourth wiring 117 of the fourth interconnect layer. Moreover, a lower part of the third via 127 that couples the fourth interconnect layer (4Cu) and the upper electrode has the same structure as that of the cylinder-shaped dummy capacitance element. For this reason, even if the depth of the third via 127 is shallower than the logic circuit, the third via 127 does not pierce through.

Third Embodiment

Figure 8:
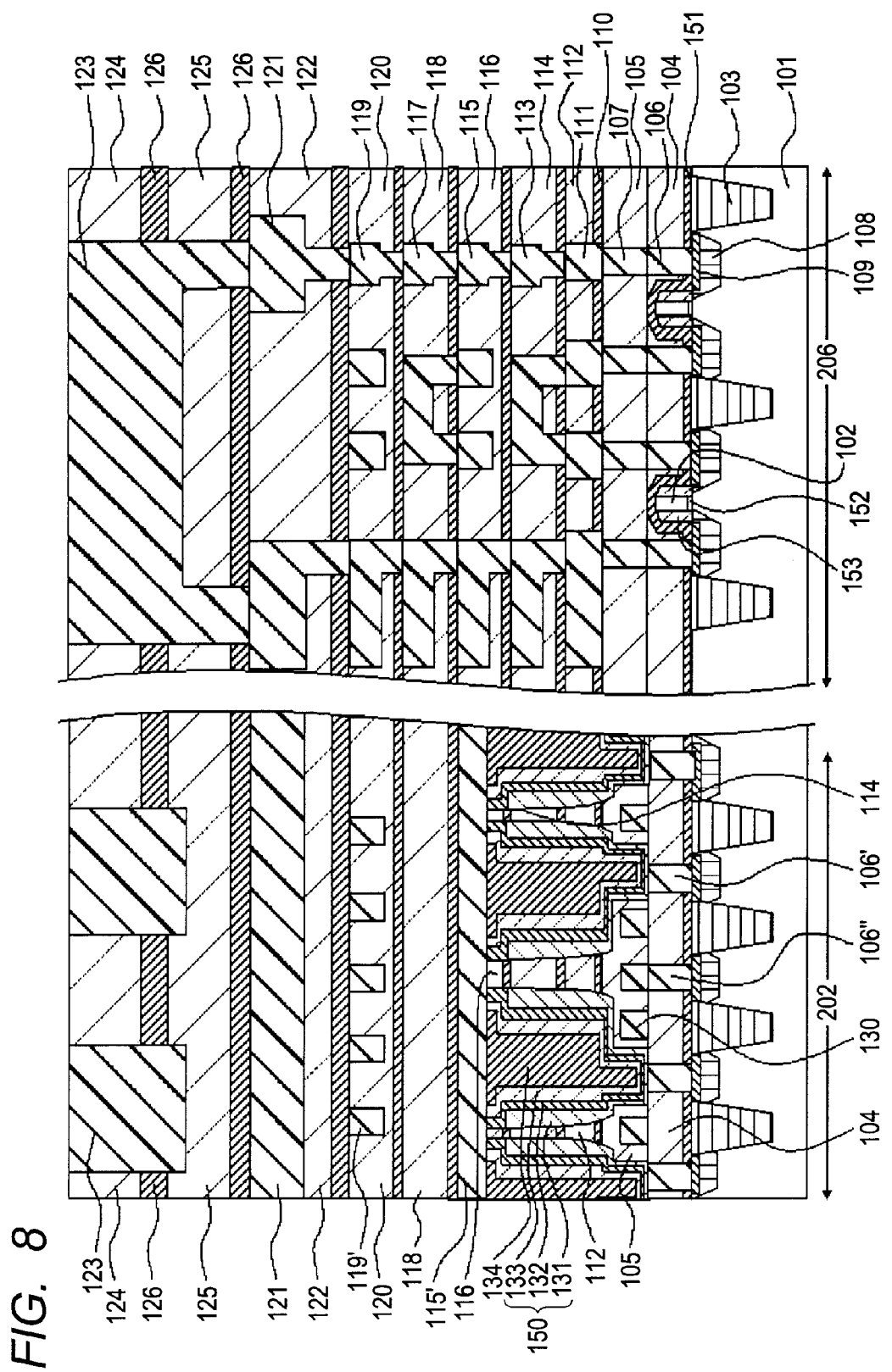
FIG. 8 is a sectional view showing a semiconductor device in a third embodiment of the present invention.

FIG. 8 is a sectional view showing a semiconductor device in a third embodiment.

The third embodiment is different from the first embodiment in that the capacitance element 150 has an SAC (Self-Align Contact) structure and the second capacitor contact does not exist.

In the third embodiment, a part of the bottom of the capacitance element 150 is provided in the shape of protrusion toward a lower side of the bottom. In other words, the protrusion is provided in the part of the bottom of the capacitance element 150 in a direction parallel to a stacked layer direction of the multilayer interconnect layers and also in a direction going toward the silicon substrate 101 from the capacitance element 150. Here, for example, the stacked structure of W wiring (the bit line 130)/SiN hard mask is given an opening using a lithography mask, further a side wall of SiN is formed, and the W wiring is covered with SiN. Then, it is given a cylinder-shaped opening (the opening part) and further the second contact insulating layer 105 (SiO2) is etched. At this time, the cylinder (the opening part) reaches the lower contact (the first capacitor contact 106') without making a short circuit with a W line protected by a SiN film. In the case where a stacked structure of W wiring (the bit line 130)/SiO$_2$ hard mask is used, a SiN film is used for the second contact insulating layer 105. Thereby, it is possible to prevent a short circuit of the bit line 130 and the first capacitor contact 106' by a selection ratio relative to SiO2 at the time of etching the second contact insulating layer 105 (SiN film).

In the third embodiment, a space of the second capacitor contact in the first embodiment can be used as a space for the capacitance element 150. Thereby, in the state of no-existence of the second capacitor contact, the capacitance element 150 can be coupled to the diffusion layer 108 through the first capacitor contact 106'. For this reason, the second contact becomes unnecessary in the memory cell area 202. In this case, it becomes possible to reduce a contact resistance by embedding the second contact 107 of the logic circuit with Cu to make it to Cu-Plug. In the third embodiment, it is possible to improve the capacitor capacitance only in a bottom portion of the protruding part as compared with the first embodiment. Also in the third embodiment, the same effect as that of the first embodiment can be acquired.

Fourth Embodiment

Figure 9:
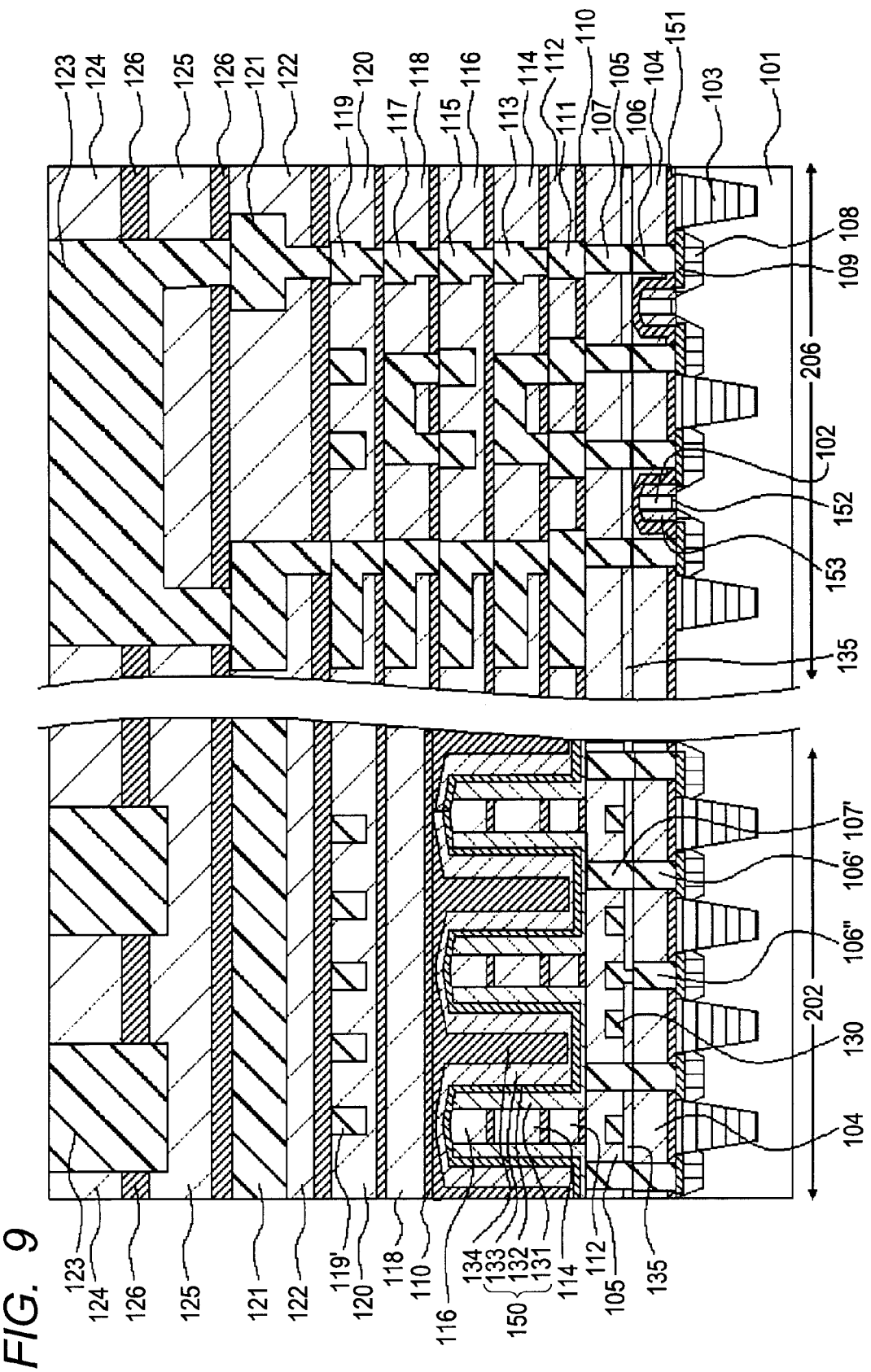
FIG. 9 is a sectional view showing a semiconductor device in a fourth embodiment of the present invention.

FIG. 9 is a sectional view showing a semiconductor device in a fourth embodiment.

The fourth embodiment is different from the first embodiment in that a bit contact insulating layer 135 is provided between the first contact insulating layer 104 and the second contact insulating layer 105.

In this embodiment, the bit contact insulating layer 135 is provided around the first capacitor contact 106'. The bit contact insulating layer 135 has a predetermined thickness. Thereby, formation positions of the first capacitor contact 106' and the bit line 130 can be separated. For this reason, it is possible to reduce more surely a probability that the bit line 130 is misaligned and the bit line 130 and the first capacitor contact 106' make a short circuit. Moreover, also in the fourth embodiment, the same effect as that of the first embodiment can be acquired.

Fifth Embodiment

Moreover, in a fifth embodiment, the bit line that is local interconnection of the memory circuit area 200 can be of the same material as the wiring material of the logic circuit part (for example, the first wiring). The material of the bit line can be the same as the wiring material, for example, being copper.

Figure 10:
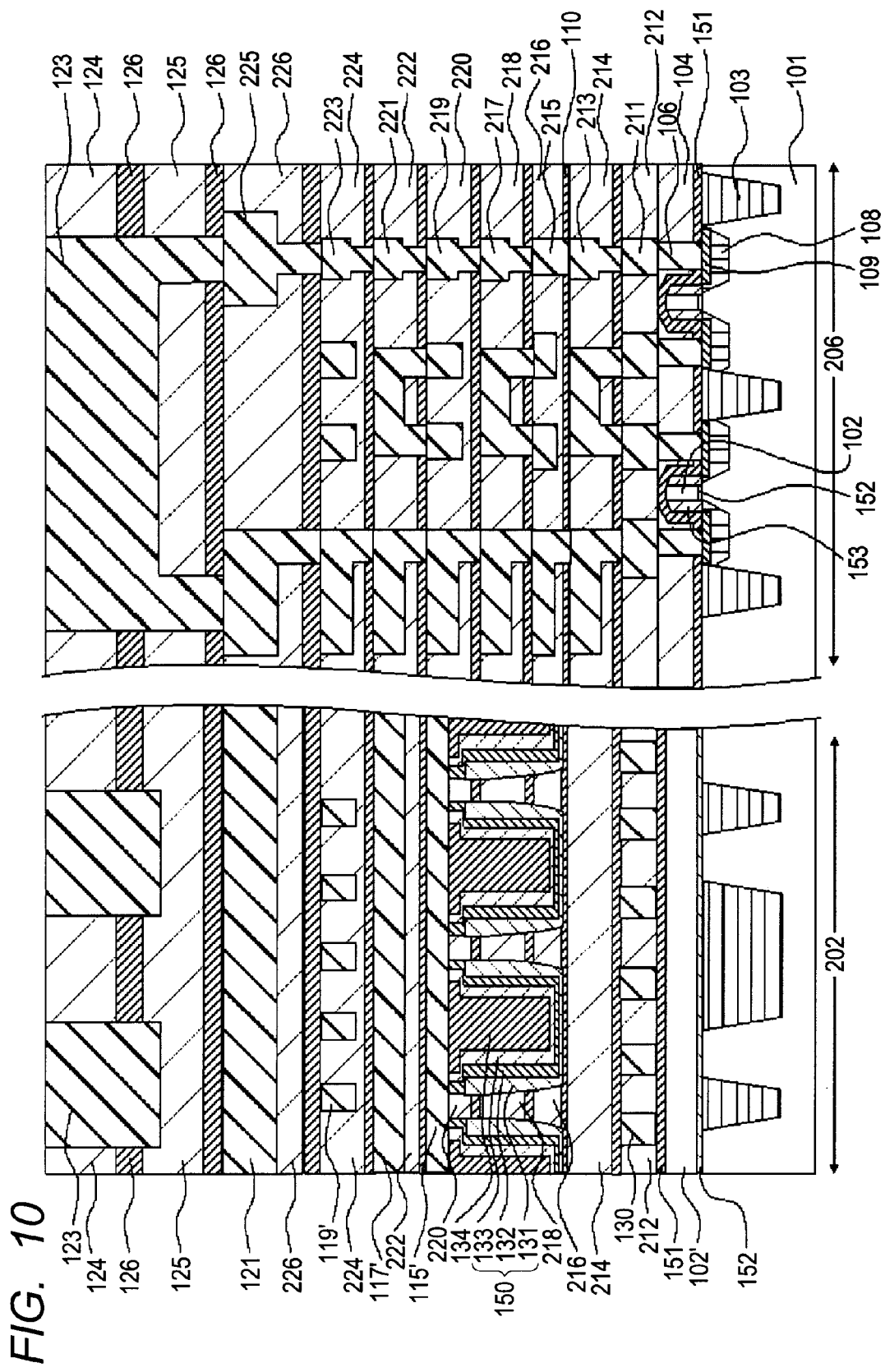
FIG. 10 is a sectional view showing a semiconductor device in a fifth embodiment of the present invention.

FIG. 10 is a sectional view showing a semiconductor device in a fifth embodiment. FIG. 10 shows it in comparison with that of FIG. 4 of the first embodiment. Here, the fifth embodiment is specified in that the local interconnect layers are comprised of seven layers. As compared with the logic circuit area 206 of FIG. 4, it is configured so that the second contact and the second contact insulating layer may not exist and the first interconnect layer formed simultaneously with the bit line 130 is formed in a first local interconnect insulating layer 212. On the top of that layer, there are formed sequentially: a second local interconnect insulating layer 214, a second interconnect layer 213, a third local interconnect insulating layer 216, a third interconnect layer 215, a fourth local interconnect insulating layer 218, a fourth interconnect layer 217, a fifth local interconnect insulating layer 220, a fifth interconnect layer 219, a sixth local interconnect insulating layer 222, a sixth interconnect layer 221, a seventh local interconnect insulating layer 224, and a seventh interconnect layer 223; and above these, a semi-global interconnect insulating layer 226 and an eighth interconnect layer 225 (semi-global wiring) are formed.

A manufacture method of the fifth embodiment can perform the following steps of: forming the first local interconnect layer in the memory circuit area 200 and the logic circuit area 206; forming the local interconnect layers comprised of (M−N) layers in the logic circuit area 206; forming the capacitance element 150 over the local interconnect layers of (M−N) layers; after the steps above, further forming remaining local interconnect layers over the local interconnect layers and over the capacitance elements 150. That is, the bit line and the first wiring can also be formed in the same layer (simultaneously). In this case, in the memory circuit area 200, the capacitance element 150 is formed over the interconnect layers comprised of (M−N) layers and subsequently the local interconnect layers comprised of N layers are formed. Also in such a semiconductor device, the effect equivalent to that of the first embodiment can be acquired.

Although the embodiments of the present invention were described with reference to the drawings in the foregoing, these are exemplifications of the present invention and can also adopt various configurations other than what was mentioned above.

Although the semiconductor device in which the memory circuit having the DRAM and the logic circuit were mounted together was explained, this embodiment can be applied to a case of a semiconductor device in which a memory circuit that has, for example, PRAM's and ReRAM's instead of the DRAM and a logic circuit are mounted together as long as it has memory cells and an upper power supply line placed above them and performs writing and reading of the memory cells by selecting a memory cell by a transistor.

In this embodiment, it is possible to place the memory element in the thickness direction space (a space of a difference) that is equivalent to a difference between the number of local interconnection required to be placed over the memory elements and the number of the local interconnect layers required to be placed over the logic/SRAM circuit (in the case where the bit line is formed with a material different from that of the logic circuit, difference is replaced by "difference+1"). A maximum of the height of the memory element that can be placed will be restricted by the space of difference. At this time, in the case of the DRAM, the dielectric constant of the capacitance insulating film can be increased, and, in the case of PRAM and ReRAM, specific resistance of the resistor can be increased. Thereby, performance as a storage element (memory element) and the operating frequency of the logic circuit can be balanced. Furthermore, in addition to these, a production cost can be balanced to the performance.

[Additional Remarks]

(1) A method for manufacturing a semiconductor device including a memory circuit area and a logic circuit area comprising:

when the number of insulator layers forming a multilayer local interconnect layer formed in the logic circuit area is M and the number of insulator layers forming a multilayer local interconnect layer formed in the memory cell area is N (M and N are natural numbers and satisfy M>N);

forming a bit line which is one of a local interconnect in the memory circuit area;

forming local interconnect layers comprised of (M−N+1) layers in the logic circuit area;

forming a memory element so that a height of the memory element and a height of the (M−N+1) layers is same height; and forming remaining local interconnect layers over the local interconnect layers and over the memory elements.

(2) A method for manufacturing a semiconductor device including a memory circuit area and a logic circuit area comprising:

when the number of insulator layers forming a multilayer local interconnect layer formed in the logic circuit area is M and the number of insulator layers forming a multilayer local interconnect layer formed in the memory cell area is N (M and N are natural numbers and satisfy M>N);

forming a first local interconnect layer in the memory circuit area and the logic circuit area;

forming local interconnect layers comprised of (M−N) layers in the logic circuit area;

forming a memory element so that a height of the memory element and a height of the (M−N) layers is same height; and forming remaining local interconnect layers over the local interconnect layers and over the memory elements.

(3) The method for manufacturing a semiconductor device described in (1), wherein the forming the memory element is performed at 350° C. or lower.

What is claimed is:

1. A semiconductor device, comprising:
   a substrate including a memory circuit area and a logic circuit area;
   a memory capacitor element formed in the memory circuit area;

a multilayer local interconnect layer formed in the memory circuit area by stacking N insulator layers where each insulator layer has an interconnect and a contact or via; and a multilayer local interconnect layer formed in the logic circuit area by stacking M insulator layers where each insulator layer has an interconnect and a contact or via such that the interconnect has a minimum pitch comparable to a minimum pitch in an interconnect of an insulating layer closest to the substrate, wherein M and N are natural numbers, wherein M>N, M−N≧2, and N≧2, and wherein the memory capacitor element is formed in a multilayer local interconnect layer comprised of (M−N) layers so that a height of the memory capacitor element substantially equals a height of the (M−N) layers.

2. The semiconductor device according to claim 1, wherein the multilayer local interconnect layer formed in the memory circuit area includes at least two of a bit line, an upper electrode line, word shunt line, and a global bit line.

3. The semiconductor device according to claim 1, wherein the multilayer local interconnect layer formed in the memory circuit area includes a word shunt line and a global bit line, the word shunt line and the global bit line being formed simultaneously with the multilayer local interconnect layer formed in the logic circuit area.

4. The semiconductor device according to claim 1, wherein the memory circuit area further includes an input/output circuit area.

5. The semiconductor device according to claim 1, wherein the M insulator layers of the multilayer local interconnect layer formed in the logic circuit area are each disposed at a respective level, and wherein the N insulator layers of the multilayer local interconnect layer formed in the memory circuit area and the (M−N) layers of the memory element multilayer local interconnect layer are each disposed at a same respective level as a corresponding M insulator layer of the multilayer local interconnect layer formed in the logic circuit area.

6. The semiconductor device according to claim 1, wherein a material of the interconnect is mainly copper.

7. The semiconductor device according to claim 2, wherein a material of the bit line is selected from the group of tungsten, aluminum, titanium, titanium nitride, tantalum, and tantalum nitride as a main component.

8. The semiconductor device according to claim 1, wherein a part of a bottom of the memory capacitor element is provided in the shape of protrusion toward a lower side of the bottom.

9. The semiconductor device according to claim 1 further includes a semi-global wiring layer and a global wiring layer, wherein a number of the semi-global wiring layers and global wiring layers in the memory circuit area and a number of the semi-global wiring layers and global wiring layers in the logic circuit area are same.

10. The semiconductor device according to claim 1, wherein the memory capacitor element includes a plate line provided in the (M−N) layers and electrically connected to a capacitor electrode of the memory capacitor element.

11. The semiconductor device according to claim 1, wherein the N insulating layers are formed over the memory capacitor element such that the M-th insulating layer in the logic circuit area is arranged at a same level insulating layer as the N-th insulating layer in the memory circuit area.

12. The semiconductor device according to claim 1, wherein the M-th insulating layer in the logic circuit area is arranged at a same level insulating layer as the N-th insulating layer in the memory circuit area.

13. A semiconductor device, comprising:

a substrate including a memory circuit area and a logic circuit area; and a multilayer local interconnect layer formed, in the memory circuit area and in the memory circuit area, by tacking M insulating layers, wherein, in the logic circuit area, each of the M insulating layers has an interconnect and a contact or via such that the interconnect has a minimum pitch comparable to a minimum pitch in an interconnect of an insulating layer closest to the substrate, wherein, in the memory circuit area, N insulating layers of the M insulating layers each have an interconnect and are formed over the memory capacitor element, wherein a memory capacitor element is formed in the memory circuit area and in (M−N) insulating layers so that a height of the memory capacitor element substantially equals a height of the (M−N) layers, wherein M and N are natural numbers, and wherein M>N, N≧2, and M−N≧2.

14. The semiconductor device according to claim 13, wherein the N insulating layers are formed over the memory capacitor element such that the M-th insulating layer in the logic circuit area is arranged at a same level insulating layer as the N-th insulating layer in the memory circuit area.

15. The semiconductor device according to claim 13, wherein the M-th insulating layer in the logic circuit area is arranged at a same level insulating layer as the N-th insulating layer in the memory circuit area.

16. The semiconductor device according to claim 13, wherein the N-th insulating layer in the memory circuit area include a word shunt line and a global bit line.

17. The semiconductor device according to claim 13, wherein the memory capacitor element includes a plate line provided in the (M−N) layers and electrically connected to a capacitor electrode of the memory capacitor element.

* * * * *